United States Patent [19]
Koizumi et al.

[11] Patent Number: 5,935,649
[45] Date of Patent: Aug. 10, 1999

[54] METHOD FOR MANUFACTURING SIOF FILMS

[75] Inventors: Satoshi Koizumi; Masaki Yoshimaru, both of Tokyo; Yukihiro Mori; Hideaki Fukuda, both of Tama, all of Japan

[73] Assignee: ASM Japan K.K., Tokyo, Japan

[21] Appl. No.: 08/817,954

[22] PCT Filed: Aug. 21, 1996

[86] PCT No.: PCT/JP96/02335

§ 371 Date: Dec. 5, 1997

§ 102(e) Date: Dec. 5, 1997

[87] PCT Pub. No.: WO97/07537

PCT Pub. Date: Feb. 27, 1997

[30] Foreign Application Priority Data

Aug. 21, 1996 [JP] Japan .................................. 7-212004

[51] Int. Cl.$^6$ ..................... C23C 16/30; H01L 21/316
[52] U.S. Cl. ..................... 427/255.3; 427/255.2; 427/255.1; 427/99; 427/578; 438/786
[58] Field of Search ..................... 427/578, 579, 427/255.3, 255.2, 255.1, 99; 438/786

[56] References Cited

U.S. PATENT DOCUMENTS 5,413,967  5/1995  Matsuda et al. ..................... 437/235
5,563,105  10/1996  Dobuzinsky et al. ................ 437/240

FOREIGN PATENT DOCUMENTS 7-22316   1/1995  Japan .
7-90589   4/1995  Japan .
7-211708  8/1995  Japan .

OTHER PUBLICATIONS

"Formation technology of Low Dielectric Constant SiOF Film Using C2F6 Additional PECVD System", Takashi Usami, et al. pp. 68–73 No other data!.

Extended Abstract (The 54th Autumn Meeting, 1996); The Japan Society of Applied Physics, JSAP Catalog No.: AP931122–02, p. 687, S. Mizuno, et al. No month data.

Japanese Journal of Applied Physics Jan. 1994, vol. 33, No. 1B, Issn 0021–4922, p. 408–p. 412, Takashi Usami, et al.

"A Study of Film Structure in PECVD SiOF", Takashi Usami, et al., VLSI R&D Center, Oki Electric Industry Co., Ltd., Technical Report of IEICE. SDM94–146(1994–11), pp. 43–48.

A Study of Film Structure in PECVD SiOF(II), Satoshi Koizumi, et al., VLSI R&D Center, Oki Electric Industry Co., Ltd., Technical Report of IEICE. SDM95–180(1995–12), pp. 41–45.

*Primary Examiner*—Roy V. King
*Attorney, Agent, or Firm*—Knobbe, Martens, Olson & Bear, LLP

[57]  ABSTRACT

There is provided a method for reducing absorptivity of moisture of an insulation film made of SiOF and for achieving a highly reliable semiconductor device.

In a method for manufacturing a semiconductor device utilizing a silicon oxide film including fluorine as a layer insulation film of a semiconductor integrated circuit, an inert gas 14 is introduced in addition to source gases 11–13 during the formation of the silicon oxide film including fluorine (FIG. 1).

1 Claim, 2 Drawing Sheets

METHOD FOR MANUFACTURING SIOF FILMS

This application is a 371 of PCT/JP96/02335.

TECHNICAL FIELD

The present invention relates to a method for manufacturing semiconductor devices and, more particularly, to a method for forming a layer insulation film utilizing a silicon oxide film.

BACKGROUND ART

For example, conventional techniques in this field include that disclosed in an article "A Study on the Structure of PE-CVD SiOF Films" by Takashi Usami et al. on Shingaku Giho SDM 94-146 (November, 1994).

Silicon oxide films (SiO2) utilizing plasma enhanced chemical vapor deposition (PE-CVD) have been commonly used as insulation films of semiconductor devices. However, a trend toward finer and more highly integrated devices has resulted in increased capacitance between lines which has an influence on the driving power of the devices.

This has resulted in an increased need for insulation films having a lower relative dielectric constant, and fluoridated (F) silicon oxide films (SiOF) have come to attention as one of such materials having a low relative dielectric constant. As disclosed in the above-mentioned article, SiOF can be formed by mixing tetraethyl orthosilicate (TEOS), oxygen (O2), and an etching gas including fluorine (F) (e.g., $C_2F_6$, $CF_4$, $NF_3$, HF, etc.) in a reaction chamber under plasma discharge.

However, an insulation film made of SiOF formed using the above-described conventional method has high absorptivity of moisture and absorbs a large amount of moisture thereinto.

This has resulted in problems including that:

(1) it can cause corrosion of a metal line which is a factor of a semiconductor device; and (2) it reduces the lifetime of a transistor which forms a factor of a semiconductor device, and this has made it difficult to manufacture semiconductor devices of high reliability.

It is an object of the present invention to eliminate the above-described problems and to provide highly reliable semiconductor devices by reducing the absorptivity of moisture of insulation films made of SiOF.

DISCLOSURE OF THE INVENTION

In order to achieve the above-described object, according to the present invention:

(1) in a method for manufacturing a semiconductor device utilizing a silicon oxide film including fluorine as a layer insulation film of a semiconductor integrated circuit, an inert gas is introduced in addition to source gases during the formation of said silicon oxide film including fluorine, which, as a result, makes it possible to improve the efficiency of dissociation of the material gas, thereby allowing the formation of a more uniform film;

(2) in a method for manufacturing a semiconductor device according to the above (1), said inert gas is at least one gas selected from helium and argon, which results in an increased compressive stress of the SiOF film to allow the film to be denser; and (3) in a method for manufacturing a semiconductor device according to the above (1), said source gases include tetraethyl orthosilicate (TEOS), hexafluorocarbon ($C_2F_6$), and oxygen ($O_2$) used as a silicon source, a fluorine source, and an oxidizer, respectively, and the inert gas is used in an amount which is seven times or more of that of the silicon source gas, which improves the absorptivity of moisture of the film thus formed, and such an effect is further enhanced by increasing the amount of helium supplied.

BEST MODE FOR CARRYING OUT THE INVENTION

Embodiments of the present invention will now be described with reference to the drawings.

Figure 1:
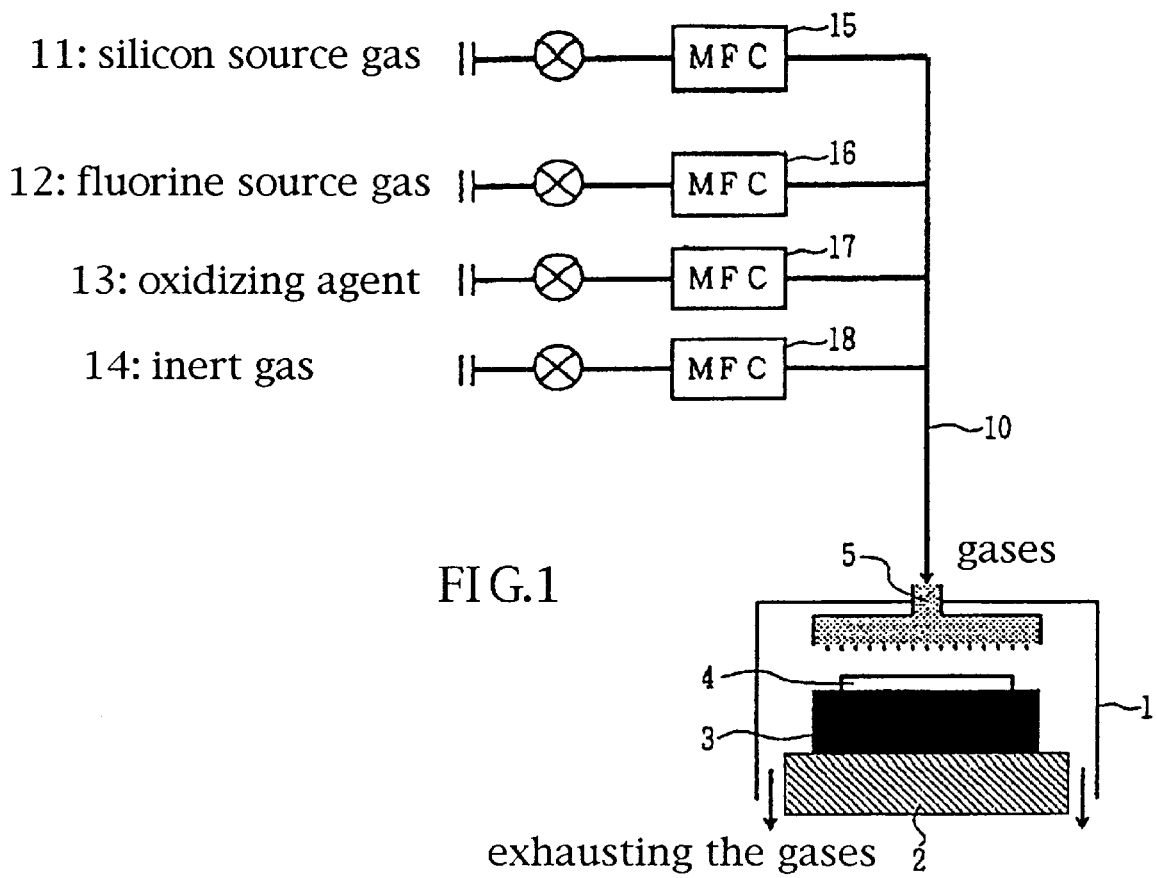
FIG. 1 illustrates a PE-CVD apparatus used for forming a SiOF layer insulation film to indicate an embodiment of the present invention.
Figure 2:
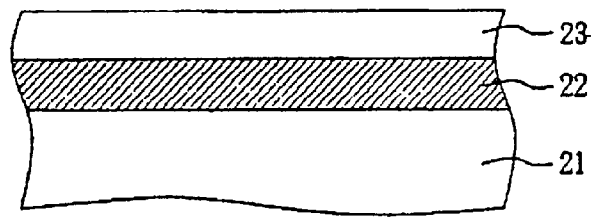
FIG. 2 is a sectional view showing the formation of a SiOF layer insulation film to indicate an embodiment of the present invention.

FIG. 1 illustrates a PE-CVD apparatus used for forming a SiOF layer insulation film to indicate an embodiment of the present invention, and FIG. 2 is a sectional view depicting the formation of a SiOF layer insulation film to indicate an embodiment of the present invention.

With reference to FIG. 1, a reaction chamber of a parallel plated-anode type PE-CVD apparatus like the prior art is referred to generally by the numeral 10. In the reaction chamber 1, there is disposed a heater 2, a susceptor 3 on the heater 2, and a wafer 4 to be processed on the susceptor 3. A gas supply port 5 is formed in the top of the reaction chamber 1, and a gas which is a mixture of source gasses, i.e., a silicon source gas 11, a fluorine source gas 12, and an oxidizer 13 is introduced to the gas supply port 5 through a pipe 10, Further, an inert gas 14 is supplied to cause plasma discharge which results in the formation of a film. MFCs (flow rate controllers) is designated by the numeral 15–18.

Specifically, when a silicon oxide film including fluorine is formed in the above-described PE-CVD apparatus, the introduction of the inert gas 14 in addition to the source gases 11–13 results in the formation of a fluoridated (F) silicon oxide film (SiOF) 22 on a substrate 21 which has semiconductor integrated circuits formed on the surface of a wafer 4 as shown in FIG. 2.

Thereafter, upper wiring layer 23 is formed on the SiOF film 22.

With such a configuration, by supplying an inert gas having high dissociating potential during the formation of the layer insulation film, the dissociation efficiency of each source gas can be improved to allow a uniform layer insulation film to be formed.

A second embodiment of the present invention will now be described.

Helium or argon which is a rare gas is used as the inert gas in the first embodiment. Film formation is performed with these rare gases introduced in the reaction chamber along with source gases.

In this case, the volume ratio of the source gases as a whole to helium or argon as the inert gas is desirably 3:1 or less.

Such a configuration results in an increased compressive stress of a SiOF film so as to make the film denser.

Figure 3:
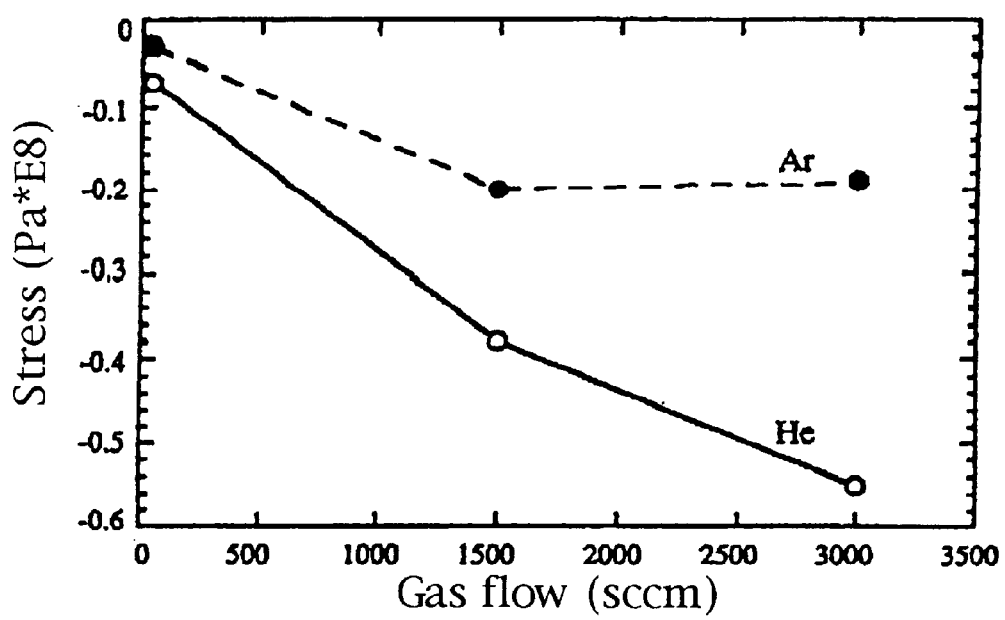
FIG. 3 illustrates a compressive stress of a SiOF film relative to the amounts of helium and argon gas supplied to indicate an embodiment of the present invention.

FIG. 3 illustrates a compressive stress of a SiOF film relative to the amounts of helium and argon gas supplied to indicate an embodiment of the present invention. The compressive stress (Pa: pascal) and the flow rate of each gas (sccm) are shown along the ordinate and the abscissa axis respectively.

As apparent from FIG. 3, while helium provides a higher effect, both helium and argon gas have a effect of increasing the compressive stress of the film as the supplied amount is increased, thereby making the film denser.

A third embodiment of the present invention will now be described.

As the source gases in the first embodiment, tetraethyl orthosilicate (TEOS), hexafluorocarbon ($C_2F_6$), and oxygen ($O_2$) are used as the silicon source, fluorine source, and oxidizer, respectively, under the condition as shown below and helium is used as the inert gas under the condition as shown below.

| | | |
|---|---:|---|
| TEOS | 140 | cc/min. |
| C2F5 | 500 | cc/min. |
| O2 | 2000 | cc/min. |
| He | 1000, 2000 | cc/min. |

Figure 4:
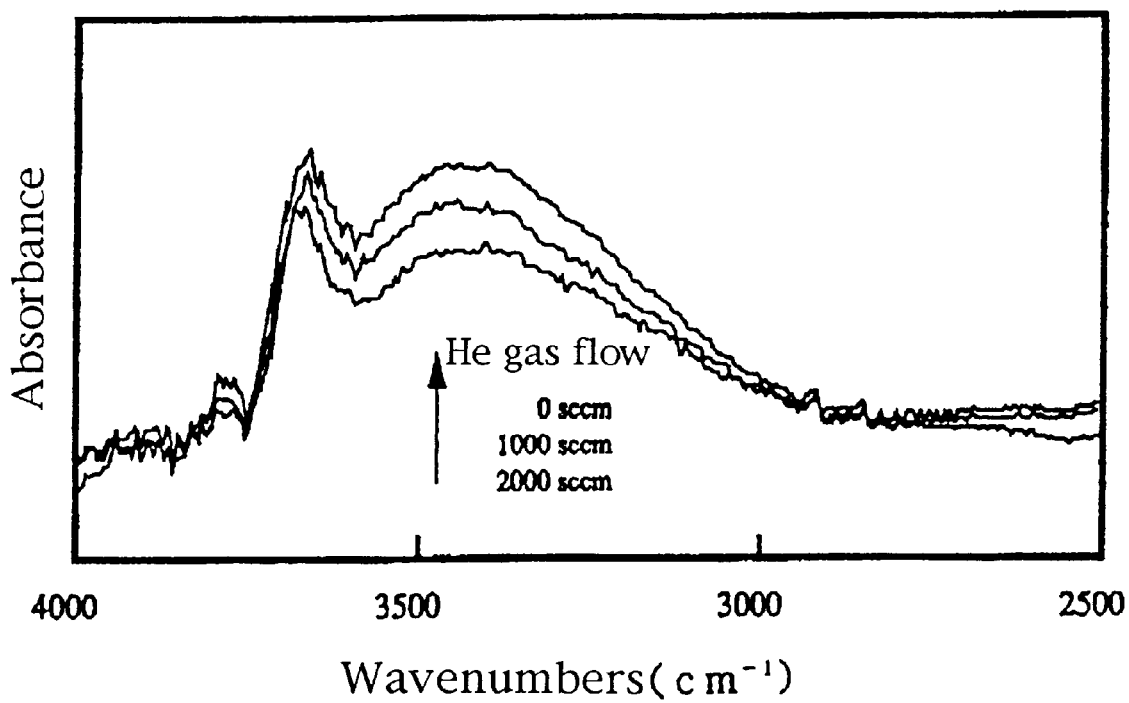
FIG. 4 illustrates an infrared absorption spectrum of a SiOF film with 2000 Å thick measured after moistening for three hours under a condition that a temperature is 80° C. and humidity is 80% under the atmospheric pressure to indicate an embodiment of the present invention.

FIG. 4 shows an infrared spectrum absorption of a SiOF film with 2000 Å thick formed under the condition as described above. In FIG. 4, the broad peak around 3400 $cm^{-1}$ represents water ($H_2O$) absorbed by the film.

FIG. 4 illustrates an infrared spectrum absorption of a SiOF film with 2000 Å thick measured after moistening for three hours under a condition that a temperature is 80° C. and humidity is 80% under the atmospheric pressure, to indicate an embodiment of the present invention.

The infrared spectrum absorption shown in FIG. 4 was measured after moistening for three hours under a condition that a temperature was 80° C. and humidity was 80% under the atmospheric pressure, and it indicates that the more helium is supplied during the formation of the film, the less water is absorbed by the film at the moistening test. Specifically, by supplying helium in an amount which is about seven times or more of that of TEOS as the silicon source gas during the formation of the film, the absorptivity of moisture of the film is improved.

Further, such an effect is enhanced by increasing the amount of helium supplied.

The present invention is not limited to the above-described embodiments and there may be various modifications based on the spirit of the present invention which are not intended to be excluded from the scope of the present invention.

As described above in detail, according to the present invention, the following effects can be achieved.

(1) According to the invention as set forth claim 1, by introducing an inert gas in addition to source gases during the formation of a silicon oxide film including fluorine, the efficiency of dissociation of the material gas can be improved so as to allow the formation of a more uniform film.

(2) According to the invention as set forth claim 2, since helium or argon gas is introduced as the inert gas, a compressive stress of a SiOF film is increased so as to allow the film to be denser.

(3) According to the invention as set forth claim 3, since source gases include tetraethyl orthosilicate (TEOS), hexafluorocarbon ($C_2F6$), and oxygen ($O_2$) used as a silicon source, a fluorine source, and an oxidizer, respectively, and the inert gas is used in an amount which is seven times or more of that of the source gases, the absorptivity of moisture of the film thus formed is improved.

Further, such an effect is enhanced by increasing the amount of helium supplied.

I claim:

1. In a method for manufacturing a silicon oxide film containing fluorine, said film being used as a layer insulating film for a semiconductor integrated circuit, wherein the improvement comprises using a mixed gas including a silicon source gas, a fluorine source gas, an oxidizer, and an inert gas, the amount of said inert gas being at least seven times that of said silicon source gas, wherein tetraethyl orthosilicate (TEOS), hexafluorocarbon ($C_2F_6$), and oxygen ($O_2$) are used as a silicon source, a fluorine source, and an oxidizer, respectively, and helium or argon is used as the inert gas.

* * * * *

UNITED STATES PATENT AND TRADEMARK OFFICE
CERTIFICATE OF CORRECTION

PATENT NO. : 5,935,649

DATED : August 10, 1999

INVENTOR(S) : Satoshi Koizumi, Masaki Yoshimaru, Yukihiro Mori and Hideaki Fukuda It is certified that error appears in the above-identified patent and that said Letters Patent is hereby corrected as shown below:

On the title page: Item [73] Assignee, add --Oki Electric Industry Co., Ltd., Tokyo, Japan-- as a second Assignee.

Signed and Sealed this

First Day of August, 2000

*Attest:*

Q. TODD DICKINSON

*Attesting Officer*  *Director of Patents and Trademarks*